United States Patent [19]

Henderson et al.

[11] Patent Number: 4,654,755
[45] Date of Patent: Mar. 31, 1987

[54] MICROWAVE/MILLIMETER WAVE GROUND PLANE

[75] Inventors: James M. Henderson; Gordon C. Henderson, both of Scottsdale, Ariz.

[73] Assignee: Motorola, Inc., Schaumburg, Ill.

[21] Appl. No.: 835,713

[22] Filed: Mar. 3, 1986

[51] Int. Cl.⁴ .............................................. H05K 1/18
[52] U.S. Cl. .............................. 361/399; 174/35 MS; 174/51; 361/424
[58] Field of Search .............................. 361/399, 424; 174/35 MS, 35 R, 36, 51

[56] References Cited

U.S. PATENT DOCUMENTS

| 2,876,277 | 3/1959 | Badger et al. | 361/399 X |
| 3,436,467 | 4/1969 | Smith | 174/35 MS |
| 3,580,981 | 5/1971 | Lamp et al. | 174/35 MS |

FOREIGN PATENT DOCUMENTS

| 2164371 | 6/1973 | Fed. Rep. of Germany | 361/399 |
| 2357892 | 5/1975 | Fed. Rep. of Germany | 174/35 MS |
| 2638293 | 3/1978 | Fed. Rep. of Germany | 361/424 |
| 1024252 | 3/1953 | France | 174/102 |

OTHER PUBLICATIONS

Metex Corp., Omni-Cell Shielded Ventilated Panels, Spec. Sheet ME-21, 1969 by Metex Corp. N.J.

Primary Examiner—R. R. Kucia
Attorney, Agent, or Firm—Raymond J. Warren

[57] ABSTRACT

The present invention consists of a ground plane comprising a conductive foil placed between a printed wire board and a chassis. The foil is deformed to provide a plurality of raised areas such that if buckling of the printed wire board occurs, the deformed areas will continue to maintain contact between the printed wire board and the chassis.

3 Claims, 6 Drawing Figures

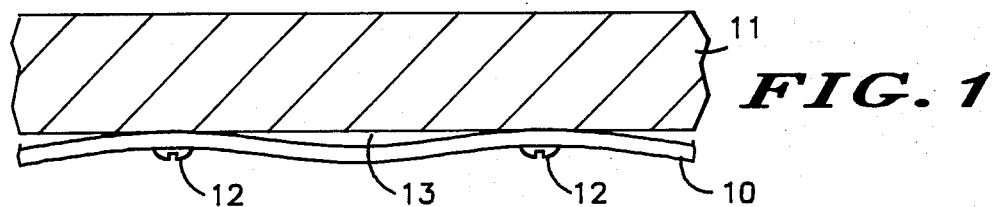
FIG. 1
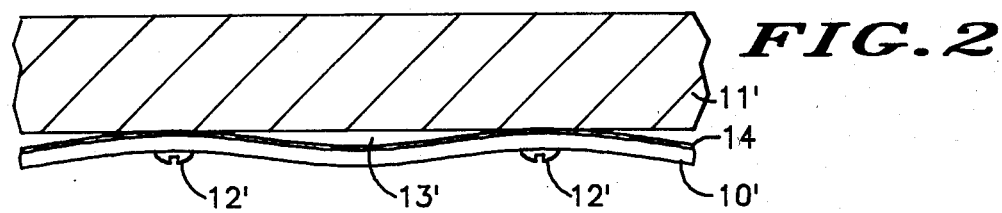
FIG. 2
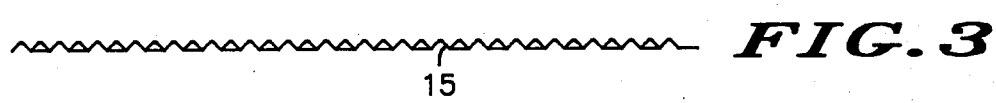
FIG. 3
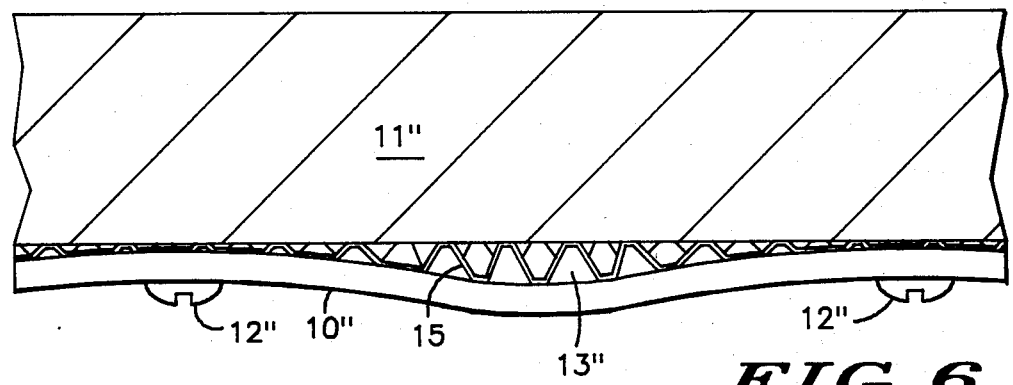
FIG. 6
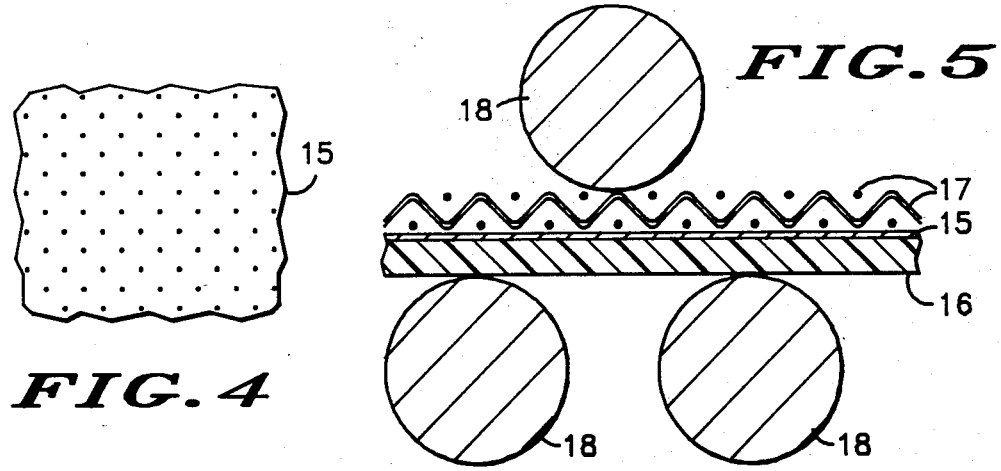
FIG. 5
FIG. 4

MICROWAVE/MILLIMETER WAVE GROUND PLANE

BACKGROUND OF THE INVENTION

This invention relates, in general, to ground planes and, more particularly, to ground planes for microwave/millimeter wave devices and antennas.

Presently, many electrical devices or antenna circuits are mounted to a printed wire board (PWB) that is in turn mounted to a chassis. The chassis will often function as a ground for the circuits on the PWB. Often this mounting will cause the printed wire board to be buckled, or oil canned, thereby not providing an even ground throughout the device. For many electrical devices this is not a concern because of the low operating frequencies. However, in the microwave/millimeter wave area a constant, uniform ground is necessary for efficient operation of the devices. The oil canning, or buckling, can cause a poor, nonuniform ground to develop thereby degrading the performance of the circuits attached to the PWB.

SUMMARY OF THE INVENTION

Accordingly, it is an object of the present invention to provide a microwave/millimeter wave ground plane that overcomes the above deficiencies.

A further object of the present invention is to provide a microwave/millimeter wave ground plane that will provide a uniform ground for a microwave/millimeter wave circuit.

Still another object of the present invention is to provide a microwave/millimeter wave ground plane that will not be adversely effected by oil canning, or deformation, of the PWB.

The above and other objects and advantages of the present invention are provided by the microwave/millimeter wave ground plane described herein.

A particular embodiment of the present invention consists of a microwave/millimeter wave ground plane comprising a conductive foil placed between the PWB and the chassis. The foil is deformed to provide a plurality of raised areas such that if oil canning does occur, the deformed areas will continue to maintain contact with the PWB and chassis.

BRIEF DESCRIPTION OF THE DRAWINGS

FIG. 1 is a partial cross-sectional view of a prior art microwave/millimeter wave ground plane;

FIG. 2 is a partial cross-sectional view of a microwave/millimeter wave ground plane;

FIG. 3 is a partial cross-sectional view of a microwave/millimeter wave ground plane embodying the present invention;

FIG. 4 is a top view of the ground plane of FIG. 3;

FIG. 5 is a method of manufacturing the ground plane shown in FIG. 3; and

FIG. 6 is a partial cross-sectional view of a microwave/millimeter wave ground plane embodying the present invention.

DETAILED DESCRIPTION OF THE DRAWINGS

Referring now to FIG. 1 a partial cross-sectional view of a prior art microwave/millimeter wave ground plane is illustrated. In FIG. 1 a PWB 10 is mounted to a chassis 11 by fasteners 12. Chassis 11 and/or metalization on PWB 10 will provide the ground in this case. As shown in FIG. 1, PWB 10 can become slightly deformed between fasteners 12 causing an open area 13 to develop. At open area 13, the ground, chassis 11, is separated from PWB 10 thereby providing a poor, nonuniform ground for the microwave/millimeter wave devices and circuits that may be contained on PWB 10.

FIG. 2 shows an intermediate attempt at a solution by the inventors in their search for a uniform ground plane. FIG. 2 is a partial cross-sectional view of the microwave/millimeter wave ground plane shown in FIG. 1 with the addition of a conductive foil 14. The elements that are the same in FIG. 2 as in FIG. 1 are identified by the same number with the addition of a prime. The result of the addition of foil 14 was to somewhat reduce area 13' but it was not eliminated. Therefore, the problem still existed even with the foil.

FIG. 3 shows a partial cross-sectional view of a foil 15 embodying the present invention. Foil 15 has been formed to contain a plurality of deformations. The deformations illustrated in FIG. 3 are of a triangular shape, however, it should be noted here that the deformations could be of various shapes and need not be continuous. A top view of foil 15 is shown in FIG. 4. As shown the deformations are contained throughout foil 15.

A process by which foil 15 can be generated is illustrated in FIG. 5. FIG. 5 shows foil 15 placed between a rubber sheet 16 and a screen 17. Screen 17 is the type of mesh screen that may be found covering windows and doors. The screen is pressed into foil 15 by rollers 18. The pressure exerted on foil 15 by this process is such that foil 15 is deformed but is not torn. It should be noted here that this is but one means of processing foil 15 and that other methods may be used, such as placing sand paper over foil 15 and impressing the design. In addition, it should be noted that the pattern in foil 15 is not required to be a uniform pattern.

Referring now to the partial cross-sectional diagram of FIG. 6, a microwave/millimeter wave ground plane embodying the present invention. The elements in FIG. 6 that are the same as those in FIG. 1 are numbered the same with the addition of a double prime ("). FIG. 6 shows foil 15 disposed between PWB 10" and chassis 11". As shown, the deformations in foil 15 serve to maintain a uniform contact between PWB 10" and chassis 11" even in area 13". Since the foil is light and deformable, the areas about connectors 12" do not effect the coupling of PWB 10" to chassis 11".

Thus, it is apparent to one skilled in the art that there has been provided in accordance with the invention, a device and method that fully satisfies the objects, aims and advantages set forth above.

It has been shown that the present invention provides a microwave/millimeter wave ground plane that has a uniform ground and is not adversely effected by deformations.

While the invention has been described in conjunction with specific embodiments thereof, it is evident that many alterations, modifications, and variations will be apparent to those skilled in the art in light of the foregoing description. Accordingly, it is intended to embrace all such alterations, modifications and variations in the appended claims.

We claim:

1. A microwave/millimeter wave ground plane comprising:

a chassis having a first side;

a printed wire board having a second side coupled to said first side of said chassis; and a ground plane being disposed between said first side of said chassis and said second side of said printed wire board, said ground plane having a plurality of deformations distributed throughout and making uniform contact to both said first side of said chassis and said second side of said printed wire board throughout the area where said ground plane is sandwiched.

2. A microwave/millimeter wave ground plane comprising an electrically conducting foil having a plurality of deformations distributed throughout.

3. A microwave/millimeter wave ground plane comprising:

a chassis having a first side;

a printed wire board having a second side;

a ground plane formed of a deformable electrically conducting material having a plurality of deformations with each deformation being formed of a portion of said material displaced from said ground plane, said ground plane being disposed between said first side of said chassis and said second side of said printed wire board, said deformations allowing uniform contact therebetween;

mechanical means fixedly attaching said printed wire board to said chassis with said ground plane sandwiched therebetween and contacting said first and second sides over substantially the entire area and substantially uniformly throughout.

* * * * *